(12) United States Patent
Wolfgang

(10) Patent No.: US 6,606,723 B2
(45) Date of Patent: *Aug. 12, 2003

(54) SYSTEM, COMPUTER-READABLE MEDIUM, AND METHOD FOR VALIDATING COMMUNICATED PACKETS OF DATA AND FOR LOCATING ERRONEOUS PACKETS

(75) Inventor: H. Lewis Wolfgang, Stamford, CT (US)

(73) Assignee: KenCast, Inc., Stamford, CT (US)

(*) Notice: Subject to any disclaimer, the term of this patent is extended or adjusted under 35 U.S.C. 154(b) by 0 days.

This patent is subject to a terminal disclaimer.

(21) Appl. No.: 10/029,670

(22) Filed: Dec. 31, 2001

(65) Prior Publication Data

US 2002/0078414 A1 Jun. 20, 2002

Related U.S. Application Data

(62) Division of application No. 09/314,120, filed on May 19, 1999, now Pat. No. 6,336,200.
(60) Provisional application No. 60/086,604, filed on May 22, 1998.

(51) Int. Cl.[7] .............................................. H03M 13/00
(52) U.S. Cl. ...................... 714/752; 714/755; 714/761; 714/774; 714/776
(58) Field of Search ................................ 714/752, 755, 714/751, 747, 756, 757, 761, 774, 776; 370/469, 473, 476; 704/202, 207, 228; 709/219, 236; 375/240

(56) References Cited

U.S. PATENT DOCUMENTS

| | | | |
|---|---|---|---|
| 4,907,277 A | 3/1990 | Callens et al. | 704/202 |
| 5,600,663 A | 2/1997 | Ayanoglu et al. | 714/774 |
| 6,012,159 A | 1/2000 | Fischer et al. | 714/744 |
| 6,052,819 A | 4/2000 | Barker et al. | 714/776 |
| 6,336,200 B1 * | 1/2002 | Wolfgang | 714/752 |

* cited by examiner

Primary Examiner—Emmanuel L. Moise
(74) Attorney, Agent, or Firm—Fitzpatrick, Cella, Harper & Scinto

(57) ABSTRACT

A method is provided that verifies whether K original packets have been correctly reconstructed, and if not, locates an erroneously marked packet so that it may be removed from the reconstruction process. The reconstruction, verification and location process may then be repeated, if there are enough remaining packets, until the reconstructed original packets are deemed correct.

8 Claims, 4 Drawing Sheets

SYSTEM, COMPUTER-READABLE MEDIUM, AND METHOD FOR VALIDATING COMMUNICATED PACKETS OF DATA AND FOR LOCATING ERRONEOUS PACKETS

CROSS-REFERENCE TO RELATED APPLICATION

This application is a division of application Ser. No. 09/314,120, filed on May 19, 1999, now U.S. Pat. No. 6,336,200, which in turn claims the benefit of U.S. Provisional Application No. 60/086,604, filed on May 22, 1998.

BACKGROUND OF THE INVENTION

1. Field of the Invention

The present invention relates to a method for ensuring that packets received in a communication system are valid, and if not, to locate and correct them to the extent possible.

2. Description of Related Art

U.S. patent application Ser. No. 08/785,443, now U.S. Pat. No. 6,012,159, which is incorporated herein by reference, discloses a method for reliably transferring packets of data between a transmitter host computer and one or more receiver subscriber computers in a communication system. In particular, that patent application provides various packet-level error correction coding techniques to ensure that large, multimedia data files, including digitized music, still images or moving images, such as may be transmitted using one-way satellite broadcasting, are received error-free despite the effects of various types of noise interfering with the transmitted signal.

In many communication systems, including the aforementioned satellite broadcast system, the data bits or symbols (such as bytes) to be transmitted are most likely to be organized into larger groups called packets. When a file is sent, header packets preceding the information packets are sent. Those header packets contain the address and control information to ensure that the following packets are received by the addressed subscriber computers. Moreover, each packet itself includes header bytes that indicate, inter alia, to which file the packet belongs and the position of the packet within that file. The remaining bytes of the packet are the body which includes the informational data, such as compressed video data. For example, a packet may be 4,096 bytes long, wherein the header portion is the first 16 bytes, and the body portion is the remaining 4,080 bytes. A large digital object is thus transmitted as a sequence of "original" packets.

In the techniques described in U.S. patent application Ser. No. 08/785,443, now U.S. Pat. No. 6,012,159, an extra number of "wildcard" error correcting packets are encoded and transmitted with the original packets to provide a predetermined level of protection against packet loss. For example, if a file contains 180 original packets, an extra 20 wildcard packets may be encoded and transmitted with those 180 original packets, as shown in FIG. 1A, to provide against a loss of 20 original packets (approximately an 1% loss). For the reasons described in that patent application, the addressed subscriber computers can successfully reconstruct the large digital object from the received packets so long as any 180 packets, of the 200 packets transmitted, are successfully received.

Additionally, as also described in U.S. patent application Ser. No. 08/785,443, now U.S. Pat. No. 6,012,159, a large file may be broken into smaller "chunks" or "shares", each of which generally contains the same number of packets, to allow the large file to be transmitted and received by the system. Each share is individually encoded, transmitted, received and reconstructed (decoded). The file is made whole from the individual reconstructed shares. As also discussed therein, the packets of the shares may also be interleaved to provide additional protection against noise. For example, a data file of 360 original packets and 40 wildcard packets may be divided into two shares of 200 interleaved packets each, as shown in FIG. 1B. Of course, as the files become larger, the number of shares will increase.

As disclosed in U.S. patent application Ser. No. 08/785,443, now U.S. Pat. No. 6,012,159, packet-level error detection processing in the receiving subscriber computers provides an indication that a received packet is "good" or "bad". Also, an indication is made if a packet has not been received at all, i.e., "lost". The bad packets are marked as lost and are not used in further decoding. As further explained therein, as long as the number or lost packets does not exceed the number of wildcard packets, the original packets of the file or share may be completely and correctly reconstructed. Continuing the above examples, for each file or share, at least 180 packets of the 200 transmitted packets must be received as "good" packets to allow the reconstruction of the original 180 packets. The techniques for decoding the received "good" packets to reconstruct the original packets are described more fully in the above-identified application.

Those techniques assumes that the underlying packet-level error detection processing does not make any errors, i.e., that when a packet is marked as "good", it is truly error-free. However, this is not always the case. Occasionally, a packet is marked as "good" when it actually has one or more bit or symbol errors. This may occur if the error detection scheme of the underlying subscriber computer is not robust. For example, the subscriber computer may use a simple checksum error detection scheme to determine whether or not the packet is good. If the checksum fails, then the packet is marked as "bad". But even if the checksum passes and the packet is marked "good", there is a certain non-trivial probability that the packet is actually bad. In this case, the reconstructed original packets will be erroneous because the reconstruction process used a bad packet, mistakenly marked as "good" by the packet-level error detection processing. Accordingly, the subscriber computer may use an additional level of packet error detection, such as a length check on a word in a header, to reduce the number of these erroneously-marked packets. Thus, it is unlikely that more than one packet in a share will be erroneously marked. In any event, the extremely robust and strong packet reconstruction techniques described in the above-identified patent application may be weakened by a poor packet-level error detection scheme in the underlying subscriber computer.

SUMMARY OF THE INVENTION

Accordingly, it would be desirable to provide a method and system that overcomes the above-described problems. In particular, a method is provided that verifies whether the original packets have been correctly reconstructed, and if not, locates an erroneously marked packet so that it may be removed from the reconstruction process. The reconstruction, verification and location process may then be repeated, if there are enough remaining packets, until the reconstructed original packets are deemed correct.

Because the method of the present invention detects and locates erroneous packets independently of the packet-level error detection processing of the subscriber computer, successful packet reconstruction is not hampered by the inability of the subscriber computer to detect erroneous packets reliably.

BRIEF DESCRIPTION OF THE DRAWINGS

The various aspects of the present invention can be best understood by reference to the detailed description of the preferred embodiments set forth below taken with the drawings, in which.

DETAILED DESCRIPTION OF THE PREFERRED EMBODIMENTS

As set forth in U.S. patent application Ser. No. 08/785,443, now U.S. Pat. No. 6,012,159, a general forward error-correcting (FEC) coding technique (1) encodes a data file of K original packets, yielding N encoded packets to be transmitted, which includes both the information of the original packets and that required for error correction at the receiver (see FIGS. 3A and 4, and corresponding text, of U.S. patent application Ser. No. 08/785,443). Another, more specific, coding technique (2) is set forth in that patent application, in which the N transmitted packets consist of the K original packets and N-K encoded error correcting "wildcard" packets (see FIG. 5, and corresponding text, of U.S. patent application Ser. No. 08/785,443, now U.S. Pat. No. 6,012,159,).

For a clearer and more concise description, the below-described verification and location methods of the present invention assume that the specific coding technique (2) of U.S. patent application Ser. No. 08/785,443 has been used by the transmitting host computer. However, as one skilled in the art will appreciate, the verification and location methods of the present invention may be equally extended to the general FEC coding technique (1) of U.S. patent application Ser. No. 08/785,443, now U.S. Pat. No. 6,012,159.

The verification and location methods described below may be applied to one-way and two-way communication or computer systems, and especially to those systems that transmit a file from one host computer to many subscriber computers. Examples of such "one-to-many" communication and computer systems respectively include satellite broadcast systems and the Internet. The host computer transmits the encoded file of packets through a transmitter to one or more receivers, which in turn transfer the received packets to the corresponding subscriber computers for decoding and further processing.

Each subscriber computer may process the received packets using bit or symbol-level EDAC hardware or software to detect and correct, if possible, any errors at the bit or symbol level, although this step is not necessary. The subscriber computer at least checks for erroneous packets at a packet level to determine whether or not the packet is "good" or "bad", the determination of which is based on the specific packet-level error detection technique used. As described above in the Background Section, a checksum or length check technique may be used for this purpose, as well as any other well-known packet level error detection technique. The packets are identified as either "good" or "bad", and any lost packets are identified as well. The packets marked "bad" are discarded. The K original packets may be reconstructed so long as there are at least K "good" packets received out of the total N packets transmitted. If less than K "good" packets are received, then the file itself is marked as bad and retransmission of the file is required.

Figure 2:
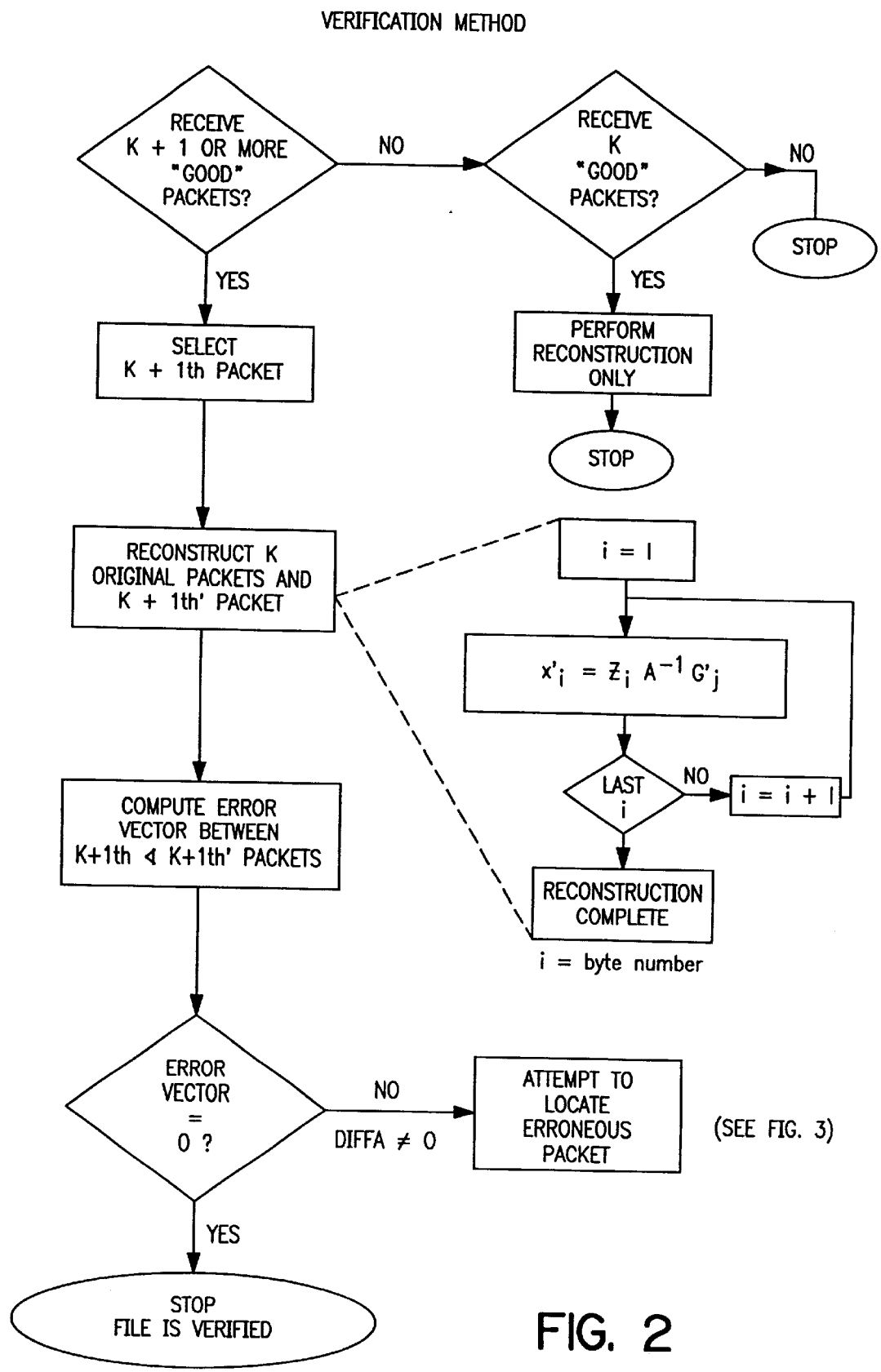
FIG. 2 is a flowchart of a validation method in accordance with an embodiment of the present invention.

On the other hand, if at least K+1 "good" packets are received, the following verification method may be performed. As shown in FIG. 2, the first step in this method is to check to see if at least K+1 "good" packets have been received (if only K "good" packets have been received, the K original packets may be reconstructed as set forth in U.S. patent application Ser. No. 08/785,443, but no verification may be performed). An extra K+1th "good" packet is selected from the K+1 or more received "good" packets (the selection of this is packet arbitrary, and for the purposes of the following equations, the position of this transmitted packet will be denoted by "j"). The K "good" packets are then used to both reconstruct the K original packets and to compute a K+1th' packet such that if the K "good" packets are truly good, the computed K+1th' packet will be identical to the jth transmitted packet. The computation is performed as follows (in which boldface type indicates a vector or matrix quantity, and non-boldface type indicates a scalar quantity):

$$x = zA^{-1},$$

where:

x is a 1×K vector containing the respective ith bytes of the K original packets, wherein "I" is the total number of bytes in a packet of bytes (1, 2, . . . , ith, . . . , I−1, I);

z is a 1×K vector containing the respective ith bytes of the K "good" packets used for reconstruction; and $A^{-1}$ is the inverse of K×K matrix A formed from the K×N code generator matrix G, as shown in FIGS. 5 and 6A–6D of U.S. patent application Ser. No. 08/785,443 and described in the corresponding text thereof.

$$x_{k+1} = zC_1,$$

where $X_{k+1}$ is the ith byte of the K+1th ' packet; and $C_1$ is a K×1 vector formed as follows:

$$C_1 = A^{-1}[G_j]$$

$G_j$ is a K×1 vector corresponding to the jth column of the code generator matrix G used in the original encoding process, as shown in FIG. 5 of U.S. patent application Ser. No. 08/785,443 and described in the corresponding text thereof.

As will be appreciated by one skilled in the art, the above equations may be combined into one equation to provide the ith bytes of both the original packets and the K+1th ' packet simultaneously, as follows:

$$x' = x \text{ concatenated with } x_{k+1}$$
$$= zA^{-1} \text{ concatenated with } zC_1$$
$$= zA^{-1}G'_j, \text{ where}$$

x' is a 1×K+1 vector containing the respective ith bytes of the K original packets and the ith byte of the K+1th ' packet; and $G'_j = (I$ concatenated with $[G_j])$, I being a K×K identity matrix, and thus $G'_j$ is a K×K+1 size matrix.

The computation of x and $x_{k+1}$, or x', is repeated for all "I" bytes of the packets until the entire K original packets and K+1th ' packet are formed.

An error vector is computed between the bytes of the selected K+1th packet and the computed K+1th ' packet. This error vector is simply the exclusive OR (XOR) of the bytes of the selected K+1th packet and the bytes of the computed K+1th' packet. An error vector of "0" indicates that there is no error in the K "good" packets, thus verifying them. Accordingly, the subscriber can be confident that the reconstructed K original packets are truly error-free, because the probability of obtaining a "0" error vector if there is actually an erroneous packet is extremely remote. However, if there is a non-zero byte in the error vector, the verification method has detected the existence of at least one error in the K+1 packets used in the method.

Figure 1A:
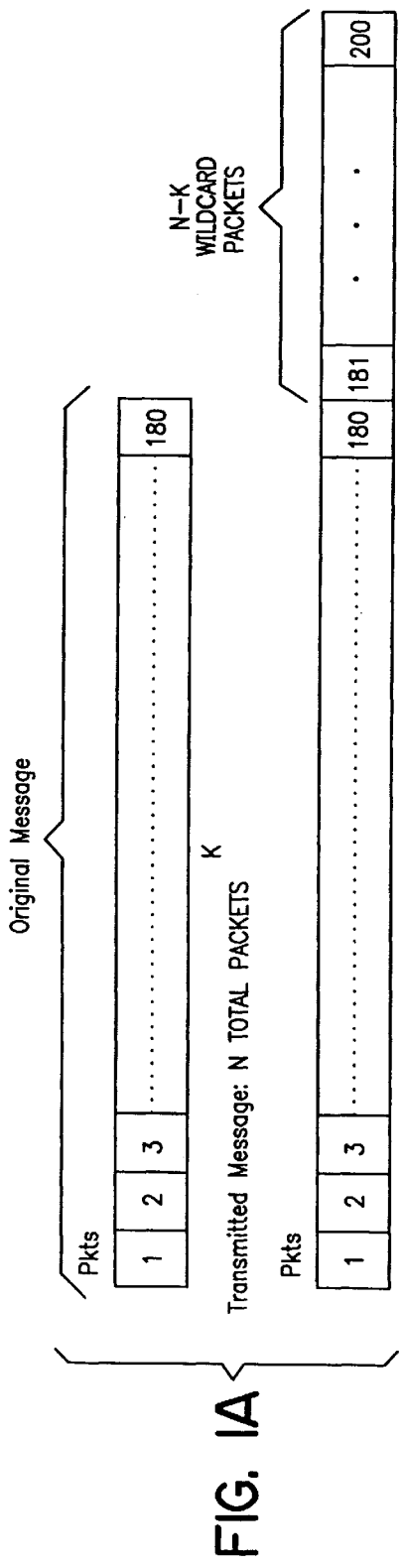
FIG. 1A depicts an example of a file of packets including original packets and wildcard packets.
Figure 1B:
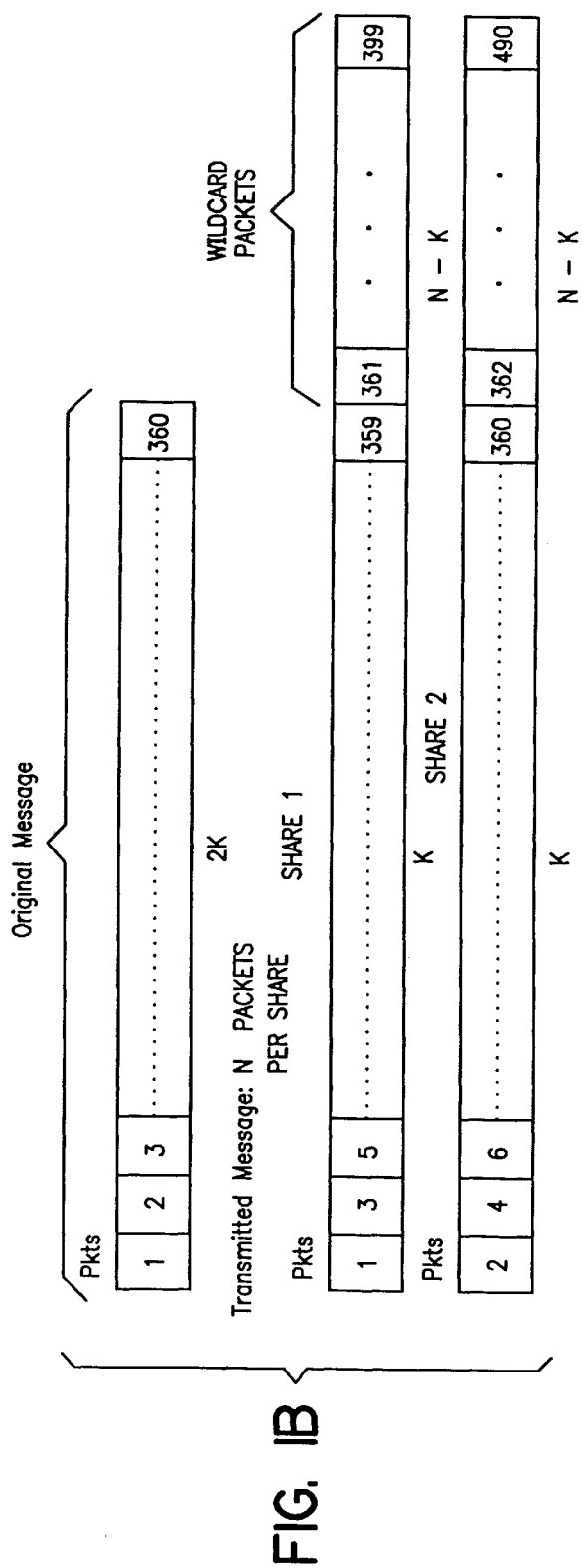
FIG. 1B depicts an example of a file with shares of interleaved packets.

In a second embodiment, the packets on the transmitting side may be interleaved into "chunks" or "shares" of packets, as shown in FIGS. 8A-8D of U.S. patent application Ser. No. 08/785,443 and described in the corresponding text thereof. In essence, each share of interleaved packets itself becomes a "mini"-file, and thus this embodiment is usually used when relatively large files need to be transmitted and received. The above verification process is then performed separately on each received share of packets. Thus, in the two-share example shown in FIG. 1B, verification is performed on the first share of received "good" packets (1, 3, 5, . . . , 399) and separately performed on the second share of received "good" packets (2, 4, 6, . . . , 400). As will be appreciated, the order in which the individual shares are verified is inconsequential. In this second embodiment, the equations used for verification are the same as the first embodiment, except the number of packets are for each share, rather than for each file. In particular, at least K+1 "good" packets must be received to verify that share.

In a third embodiment, a method is provided to locate or "pinpoint" a bad packet, erroneously marked as "good". This may be done following the verification methods described in the first or second embodiments, that is, for either a non-interleaved file of packets or each interleaved share of packets.

As mentioned above, the verification process can detect the presence of errors in the K+1 packets used therein. In particular, if there is a non-zero byte in the error vector, the verification method has detected the existence of at least one error in the K+1 packets used in the verification processing. The first non-zero byte of the error vector will be denoted as "DiffA".

As stated in the Background Section, because usually more than one packet-level error detection techniques are used to determine whether a received packet is "good" or "bad", the probability of erroneously marking more than one packet as "good" within a file or share is extremely unlikely. Because of this, the following location method assumes that when an erroneous packet has been detected in the verification process, it is the only bad packet among the K+1 "good" packets. If this is truly the case, finding the location of the single packet error is guaranteed.

Figure 3:
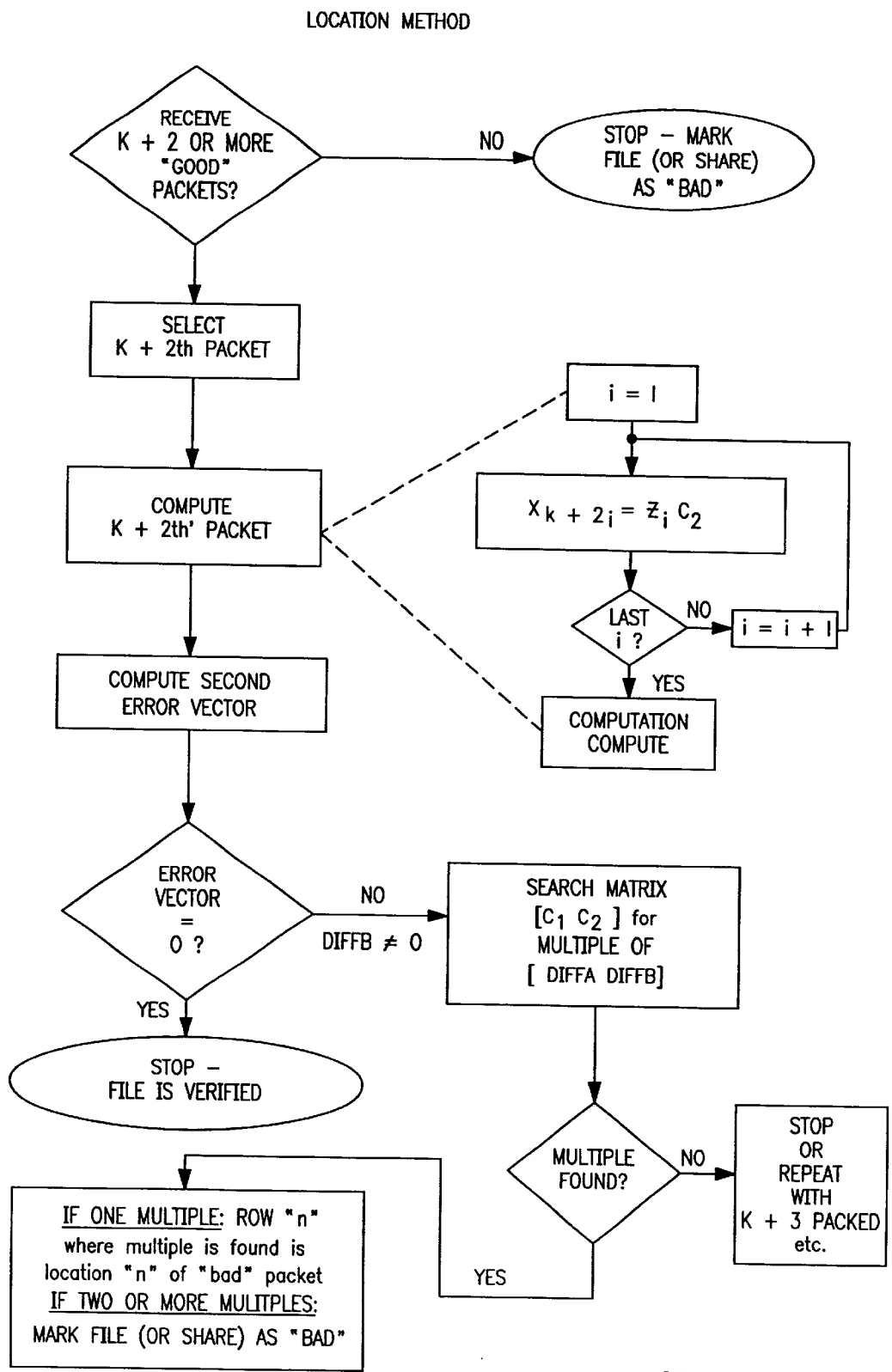
FIG. 3 is a flowchart of a location method in accordance with another embodiment of the present invention.

The location method shown in FIG. 3 may thus be performed when a non-zero error vector is obtained in the verification process, but only if a K+2th "good" packet is available. Thus, the first step of this pinpointing method checks to determine that at least K+2 "good" packets have been received. If not, the entire file or share is marked "bad" since pinpointing is not possible. However, if at least K+2 "good" packets have been received, a K+2th packet is selected (but not one of the K+1 packets used in the preceding verification process). For the following equations, this packet will be arbitrarily assumed to be at the mth transmitting position. Using the following equations, a K+2th' packet, which should be identical to the mth transmitted packet, is computed:

$$x_{k+2} = zC_2,$$

where $x_{k+2}$ is the ith byte of the K+2th' packet; and $C_2$ is a K×1 vector formed as follows:

$$C_2 = A^{-1}[G_m],$$

where $G_m$ is a K×1 vector corresponding to the mth column of the code generator matrix G used in the original encoding process, as shown in FIG. 5 of U.S. patent application Ser. No. 08/785,443 and described in the corresponding text thereof.

This computation is repeated for all "I" bytes of the K+2th' packet until the entire K+2th' packet is formed.

A second error vector is computed between the bytes of the selected K+2th packet and the computed K+2th' packet. This second error vector is the exclusive OR (XOR) of the bytes of the selected K+2th packet and the bytes of the computed K+2th' packet. A second error vector of "0" indicates that (1) the K received packets used for reconstructing the K original packets are truly good and may be relied upon, and (2) the K+1th packet used for verification was the bad packet that caused the non-zero DiffA. Thus, the K original packets of the file or share are verified as correct.

However, if the second error vector is not equal to "0", then the bad packet is in the K "good" packets and may be found. "DiffB" is defined to be the non-zero byte in the second error vector that is at the same position as that of DiffA in the first error vector. The bad packet is located using a technique based on the following equations:

$$[\text{DiffA DiffB}] = (000 \ldots 00e_n 00 \ldots 0)[C_1 \ C_2],$$

assuming that one packet is erroneous, wherein $e_n$ is the byte of that packet at the same position as DiffA and DiffB, and "n" is the location of the erroneous packet in the 1×K vector z corresponding to that byte position.

Thus, because of the zeros, $$[\text{DiffA DiffB}] = [e_n C_{1n} \ e_n C_{2n}]$$

In other words, [DiffA DiffB], previously computed, is simply a multiple of row "n" of the K×2 matrix formed by column vectors $C_1$ and $C_2$. The location "In" of the erroneous packet can thus be found by merely searching the K×2 matrix $[C_1 \ C_2]$ for a multiple of [Diff A DiffB], and determining at which row of that matrix that multiple occurs. That row "n" corresponds to the location "n" of the erroneous packet. Therefore, assuming that only one packet is erroneous, if such a row can be uniquely found in the matrix, then the location of that one erroneous packet can be pinpointed. However, if more than one row is found that is a multiple of [DiffA DiffB], which is unlikely, the entire file or share is marked bad.

Once located, the single erroneous packet can be marked as "bad" and discarded, and the reconstruction process for the file or share can be re-performed with a new set of K received "good" packets. In addition, if possible, re-verification and re-location may be performed, until the file or share has been reconstructed and verified as truly good.

If a row "n" cannot be determined, the location process may be repeated with an extra received "good" packet, i.e., a K+3th packet, if available. If the location of the erroneous packet cannot be found using this extra 3rd packet, the location process may be repeated again and again, if possible, until the erroneous packet is located. At any time, if there are no extra packets to perform the location process, then the file or share is marked "bad", requiring the retransmission thereof. Of course, if so desired, the number of location attempts may be limited, for example, to just a first attempt using K+2 packets.

Figure 4:
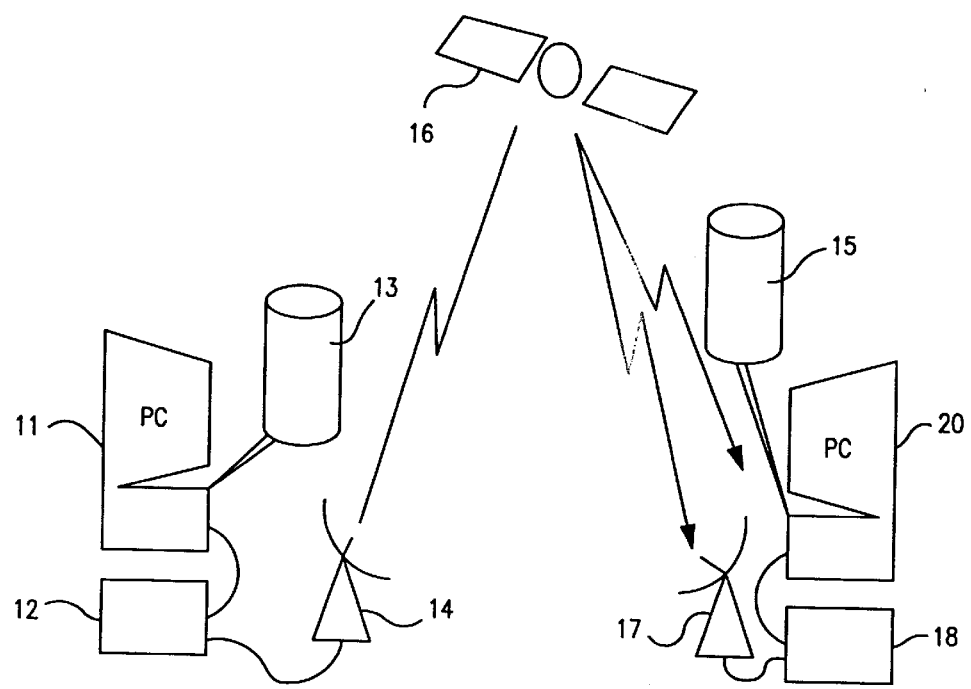
FIG. 4 depicts a system in which the methods of the embodiments of the present invention may be used.

A block diagram of one possible communication system that implements the above methods is shown in FIG. 4. This is a one-way satellite broadcast system, and includes a host computer 11, usually a PC. The host computer 11 includes or is extended with a transmission communication device 13 for the transfer of data outside the computer. The communication device can take the form of a serial card or a computer chip. The communication device 13 is connected by a cable to a satellite transmitter device 12. The satellite transmitter device 12, through an attached uplink antenna 14, broadcasts the encoded data packets to one or more subscriber computers 20 via satellite 16.

The encoded packets are received by a downlink antenna 17 (usually submeter in diameter) attached to a satellite receiver device 18, which in turn is connected to subscriber computer 20, usually a PC. The subscriber computer 20 includes or is extended with a reception communication device 15 to transfer the received packets into the subscriber computer.

The verification and location methods of the first through third embodiments may be implemented (1) by computer software, (2) by dedicated hardware, or (3) by combinations of software, hardware and firmware of the subscriber computer. The computer software may run on a Windows® 95 or Windows® NT® operating system. The software preferably runs on a Pentium® 133 MHz PC or better with at least 16 Mbyte RAM and a 1 Gbyte hard drive for storage of the large digital objects.

In addition to the high speed transmission communication device, the host computer may be set up with a relational database, a graphical user interface, and list/addressing software and transmission communication software to communicate with the transmission communication device. Data files are transmitted and received using a packet-based broadcast protocol at speeds of over 8.44 Mbps in a dedicated computer. In addition to the high speed receiver communication card, the subscriber computer may be set up with a local database, a graphical user interface and receive communication software to communicate with the receiver communication device.

Moreover, the packets may be encoded using a computer separate from the host computer. In this case, the host computer is responsible for transmitting the encoded packets. Similarly, separate computers may be used to receive the transmitted packets and to reconstruct and verify the files (and, if necessary, to locate any erroneous packets thereof).

Any type of digital file may be transmitted and received. These files may include, but are not limited to, video files (MPEG, M-JPEG), electronic documents (PDF), color images (TIF), press clippings, interactive training (CD-I, CD-ROM), news feeds, music and audio (WAV), compound documents, and other multimedia files.

Of course, it will be appreciated that the invention may take forms other than those specifically described. For example, these methods may be used in other one-way communication systems, and may also be used in two-way communication systems when it is desired to minimize the retransmission of packets.

What is claimed is:

1. A method comprising the steps of:
   receiving at least (K+1) packets of N transmitted packets of a file;
   determining whether each received packet is "good" or "bad"; and
   if (K+1) received packets are determined to be "good," validating that K packets have been successfully received using the (K+1) "good" received packets.

2. A system comprising:
   receiving means for receiving at least (K+1) packets of N transmitted packets of a file;
   determining means for determining whether each received packet is "good" or "bad"; and
   validating means for validating that K packets have been successfully received using (K+1) "good" received packets.

3. A computer-readable memory medium storing a computer-executable program comprising code which when executed implements a method comprising the steps of:
   receiving at least (K+1) packets of N transmitted packets of a file;
   determining whether each received packet is "good" or "bad"; and
   if (K+1) received packets are determined to be "good," validating that K packets have been successfully received using the (K+1) "good" received packets.

4. A method comprising the steps of:
   receiving at least (K+2) packets of N transmitted packets of a file;
   determining whether each received packet is "good" or "bad";
   if (K+2) packets are determined to be "good," validating that K packets have been successfully received using (K+1) "good" received packets; and
   if K packets are not validated because of an erroneous packet therein, locating the erroneous packet using (K+2) "good" received packets.

5. A system comprising:
   receiving means for receiving at least (K+2) packets of N transmitted packets of a file;
   determining means for determining whether each received packet is "good" or "bad";
   validating means for validating that K packets have been successfully received using (K+1) "good" received packets; and
   locating means for locating an erroneous packet among the received packets using (K+2) "good" received packets.

6. A computer-readable memory medium storing a computer-executable program comprising code which when executed implements a method comprising the steps of:
   receiving at least (K+2) packets of N transmitted packets of a file;
   determining whether each received packet is "good" or "bad";
   if (K+2) packets are determined to be "good," validating that K packets have been successfully received using (K+1) "good" received packets; and if K packets are not validated because of an erroneous packet therein, locating the erroneous packet using (K+2) "good" received packets.

7. A system for validating that K packets of a file have been successfully received by a receiver out of N packets transmitted thereto by a transmitter, said system comprising:

determining means for determining whether each received packet is "good" or "bad";

selecting means for selecting a (K+1) th packet out of at least (K+1) "good" received packets;

reconstructing means for reconstructing K original packets and a (K+1) th' packet from K of the non-selected "good" received packets, the (K+1) th' packet corresponding to the selected (K+1) th packet; and determining means for determining whether the selected (K+1) th packet and the reconstructed (K+1) th' packet are identical, whereby the K non-selected "good" received packets, and thus the reconstructed K original packets, are validated if so.

8. A computer-readable memory medium storing a computer-executable program comprising code which when executed implements a method for validating that K packets of a file have been successfully received by a receiver out of N packets transmitted thereto by a transmitter, wherein the receiver deems each received packet as "good" or "bad," the method comprising the steps of:

determining whether at least (K+1) packets have been deemed "good" by the receiver;

if so, selecting a (K+1) th packet out of at least (K+1) "good" packets;

reconstructing K original packets and a (K+1) th' packet from K of the non-selected "good" packets, the (K+1) th' packet corresponding to the selected (K+1) th packet; and determining whether the selected (K+1) th packet and the reconstructed (K+1) th' packet are identical, whereby the K non-selected "good" received packets, and thus the reconstructed K original packets, are validated if so.

* * * * *